(12) United States Patent
Yang et al.

(10) Patent No.: US 6,821,684 B2
(45) Date of Patent: Nov. 23, 2004

(54) METHOD FOR FABRICATING MASK ROM WITH SELF-ALIGNED CODING

(75) Inventors: Chun-Yi Yang, Hsinchu County (TW); Ta-Hung Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 166 days.

(21) Appl. No.: 10/064,701

(22) Filed: Aug. 8, 2002

(65) Prior Publication Data

US 2004/0029049 A1 Feb. 12, 2004

(51) Int. Cl.⁷ .............................. G03C 5/00; G03F 9/00
(52) U.S. Cl. .......................................... 430/5; 430/311
(58) Field of Search ........................... 430/5, 311, 312; 438/275, 278

(56) References Cited

U.S. PATENT DOCUMENTS 6,372,580 B1 * 4/2002 Shiau .......................... 438/275
6,440,803 B1 * 8/2002 Huang et al. ............... 438/276

* cited by examiner

*Primary Examiner*—S. Rosasco
(74) *Attorney, Agent, or Firm*—Jianq Chyun IP Office

(57) ABSTRACT

A method for fabricating a Mask ROM with self-aligned coding is described. A plurality of buried bit lines are formed in a substrate, and then a plurality of word lines are formed on the substrate crossing over the buried bit lines with first blocking strips thereon. A plurality of second blocking strips are formed between the word lines and between the first blocking strips, and then the first blocking strips are patterned into an array of blocking bumps, which define a plurality of pre-coding windows with the second blocking strips. A coding mask layer is formed on the substrate with a plurality of coding windows therein exposing selected pre-coding windows, and then a coding implantation is performed to form implanted coding regions in the substrate under the selected pre-coding regions exposed by the coding windows. The coding mask layer is then removed.

22 Claims, 13 Drawing Sheets

METHOD FOR FABRICATING MASK ROM WITH SELF-ALIGNED CODING

BACKGROUND OF INVENTION

1. Field of Invention

The present invention relates to a method for fabricating a read-only memory (ROM). More particularly, the present invention relates to a method for fabricating a mask read-only memory (Mask ROM).

2. Description of Related Art

Read-only memory (ROM) is non-volatile and can retain data as disconnected from power supply. Therefore, various electronic products use ROM to store data needed for their operations. In the family of ROM, the simplest one is namely the Mask ROM, which uses MOS transistors as memory cells and is programmed by implanting ions into the channels of selected memory cells to change the threshold voltages thereof. The presence of implanted ions determines the conducting state (On/Off) of a memory cell during reading operation.

A Mask ROM comprises a plurality of buried bit lines in a substrate and a plurality of polysilicon word lines on the substrate crossing over the buried bit lines, while the substrate under the word lines and between the buried bit lines serve as the channels of the memory cells. The process of implanting ions into the channels of selected memory cells is called coding implantation, and the data (0 or 1) stored in each memory cell is dependent on the presence of implanted ions.

Refer to FIGS. 1~2, wherein FIG. 1 illustrates a top view of a Mask ROM in the prior art, and FIG. 2 illustrates a cross-sectional view of the Mask ROM along line I—I. The Mask ROM comprises a substrate 100, parallel buried bit lines 104 and parallel word lines 102 crossing over the buried bit lines 104, wherein the word lines 102 are isolated from the substrate 100 by a gate oxide layer 108. The Mask ROM is programmed by implanting ions into the channels of selected memory cells, such as the channel of the memory cell under a coding window 106, to change the threshold voltages thereof. The presence of implanted ions determines the conducting state (On/Off) of a memory cell during reading operation.

Refer to FIG. 2 again, a patterned photoresist layer 110 is formed with a coding window 106 by using a lithography process. A coding implantation 112 is performed to implant ions into the substrate 100 under the word line 102 exposed by the coding window 106, so as to program the Mask ROM.

As the Mask ROM cell is miniaturized to increase the integration of the Mask ROM device, a photo-mask with small aperture sizes is required to form small coding windows, otherwise coding errors may occur because of the misalignment between larger coding windows and selected channel regions. However, fabricating a photo-mask with small aperture sizes is time-consuming, and is more difficult and more expensive.

Moreover, since the corners of the coding windows are rounded because of light scattering, coding errors easily occur in the prior art.

SUMMARY OF INVENTION

Accordingly, this invention provides a method for fabricating a Mask ROM with self-aligned coding without using a photo-mask with small aperture sizes, so as to reduce the fabrication cost of the photo-mask.

This invention also provides a method for fabricating a Mask ROM to prevent coding errors caused by deformation (corner rounding) of the coding windows, so as to improve the programming accuracy.

A method for fabricating a Mask ROM with self-aligned coding of this invention comprises the following steps. A plurality of buried bit lines are formed in a substrate, and then a conductive layer and a first blocking layer are sequentially formed on the substrate. The first blocking layer and the conductive layer are patterned into a plurality of first blocking strips and a plurality of word lines, respectively, and then a plurality of second blocking strips are formed between the word lines and between the first blocking strips. Thereafter, a first photoresist pattern is formed over the substrate, and then the first blocking strips are patterned into an array of blocking bumps, which define a plurality of pre-coding windows with the second blocking strips. After the first photoresist pattern is removed, a coding photoresist layer is formed on the substrate with a plurality of coding windows exposing selected pre-coding windows, wherein a coding widow is larger than a pre-coding window. Then, a coding implantation is performed using the coding photoresist layer, the blocking bumps and the second blocking strips as a mask to form implanted coding regions in the substrate under the pre-coding windows exposed by the coding windows. The coding photoresist layer is then removed.

Since the blocking bumps and the second blocking strips together define the pre-coding windows and block the regions outside the coding regions, the coding implantation can self-align to the coding regions under the coding windows to avoid coding errors even if misalignment occurs. Therefore, the coding windows can be formed larger without causing coding errors.

Moreover, each coding window is surrounded by two blocking bumps and two of the second blocking strips, and therefore has a tetragonal shape. Since the coding implantation profile of a selected memory cell under a coding window is determined by the shape of the corresponding pre-coding window, corner rounding of the coding windows will not adversely affect the coding implantation profile to cause coding errors.

Furthermore, since the coding windows can be formed larger, the aperture sizes of the photo-mask can be increased to reduce the cost of fabricating the photo-mask and to shorten the turn-around time (TAT) of mass production.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates a top view of a Mask ROM in the prior art.

DETAILED DESCRIPTION

Figure 1:
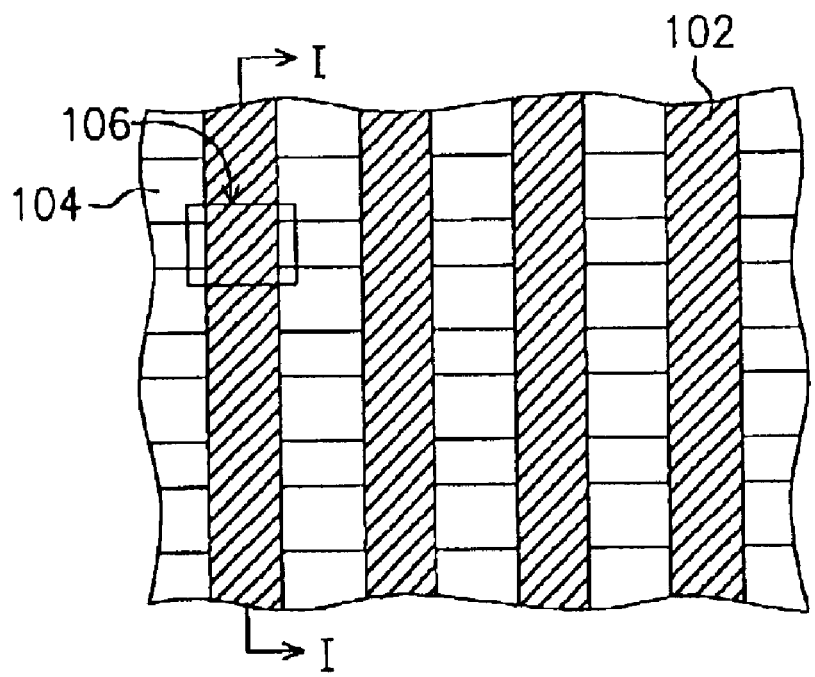
Figure 2:
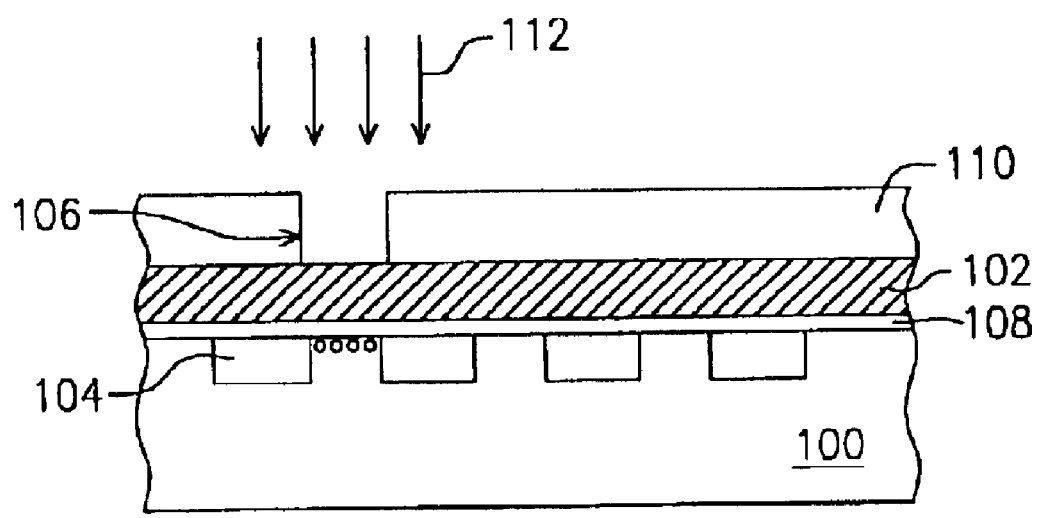
FIG. 2 schematically illustrates a cross-sectional view of the Mask ROM in FIG. 1 along line I—I.
Figure 3A:
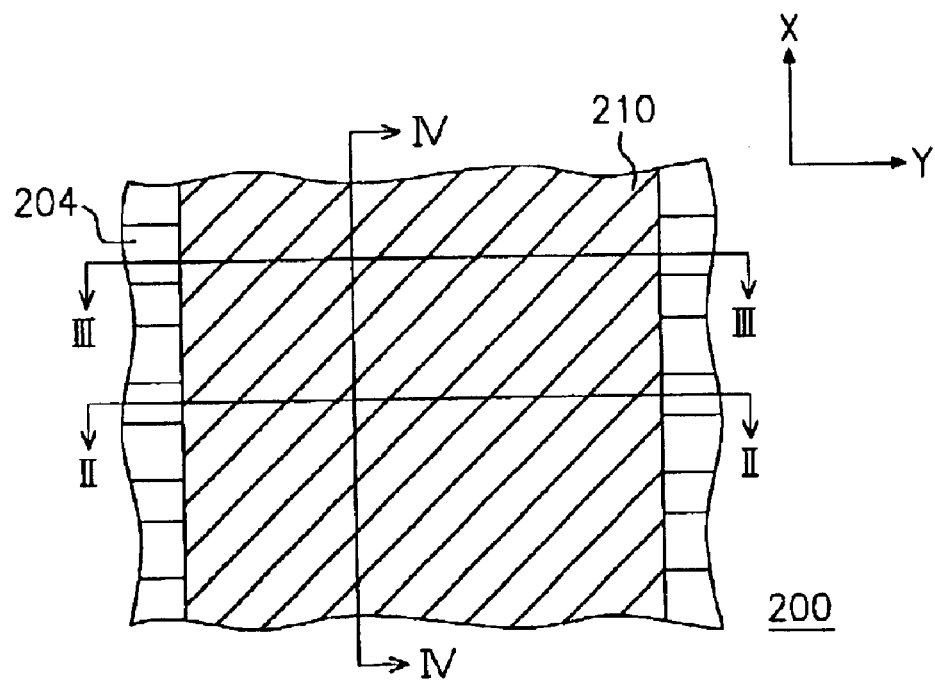
FIGS. 3A~3F schematically illustrate a process flow of fabricating a Mask ROM with self-aligned coding according to a preferred embodiment of this invention in a top view.
Figure 3B:
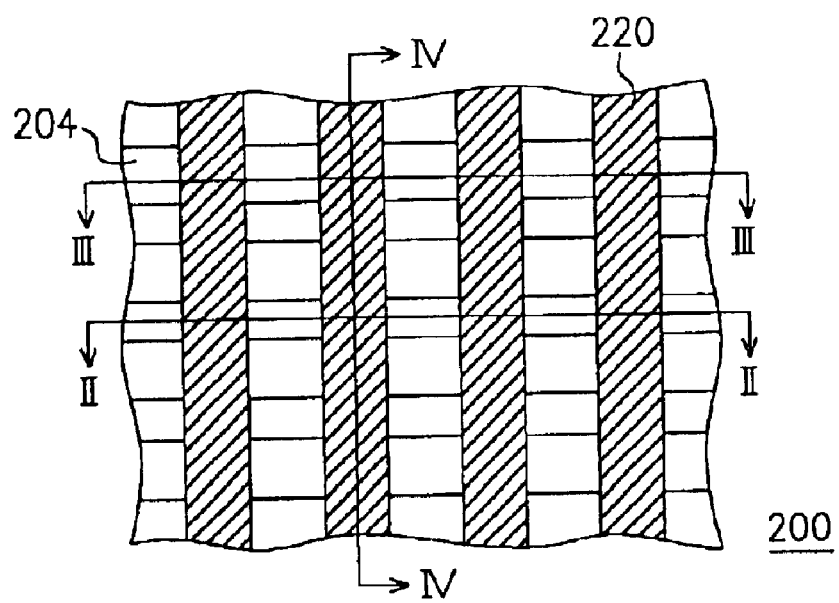
Figure 3C:
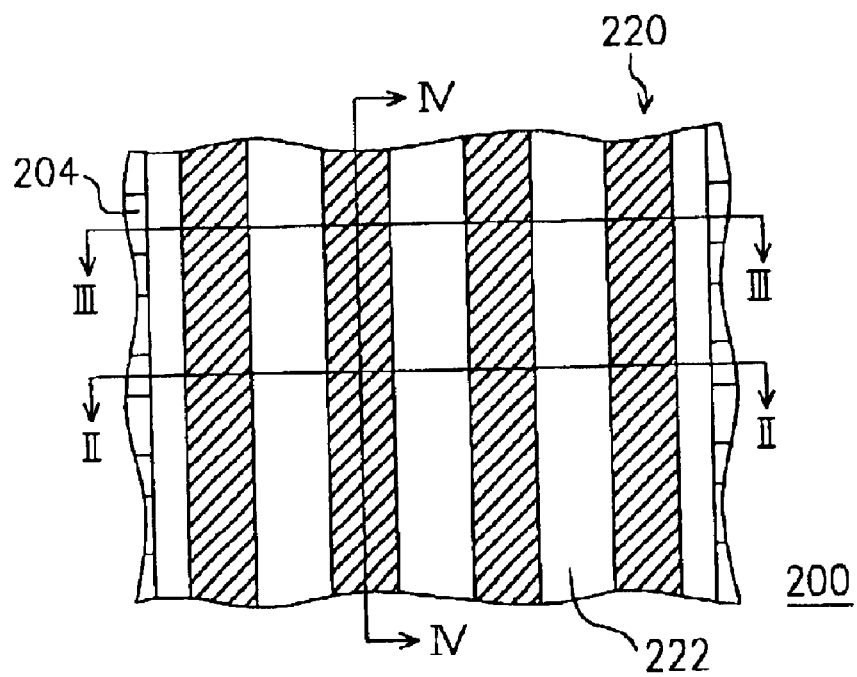
Figure 3D:
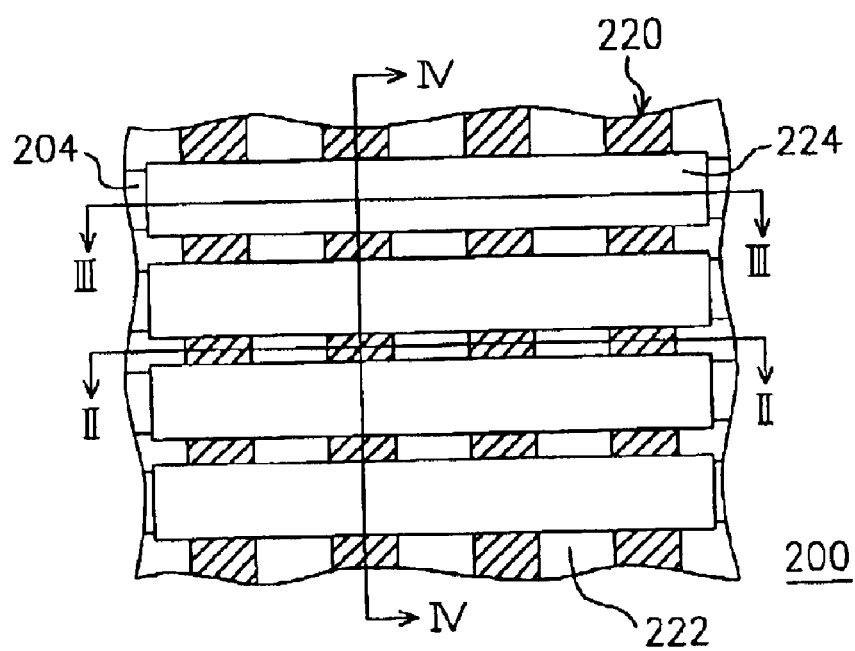
Figure 3E:
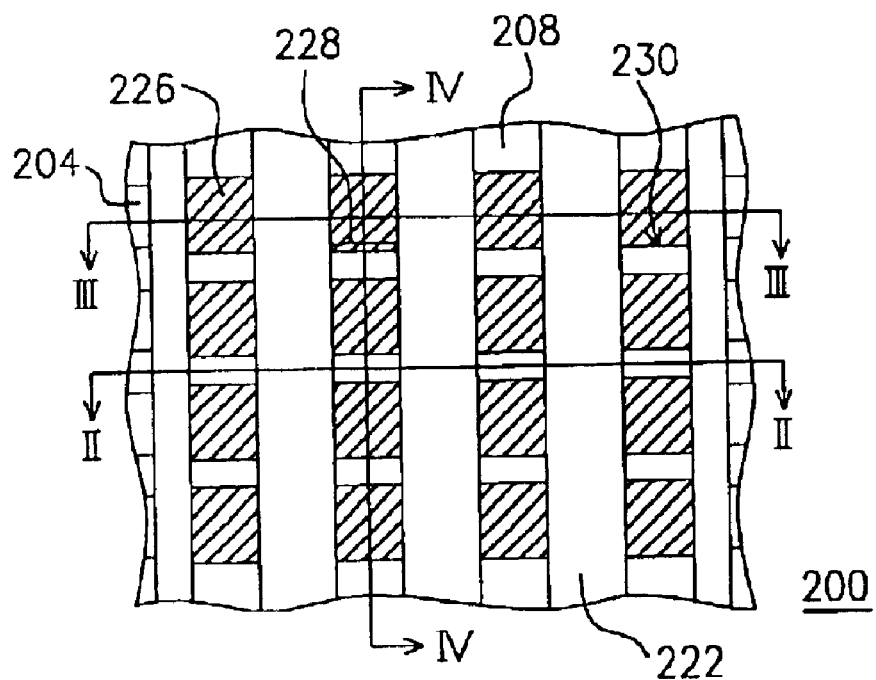
Figure 3F:
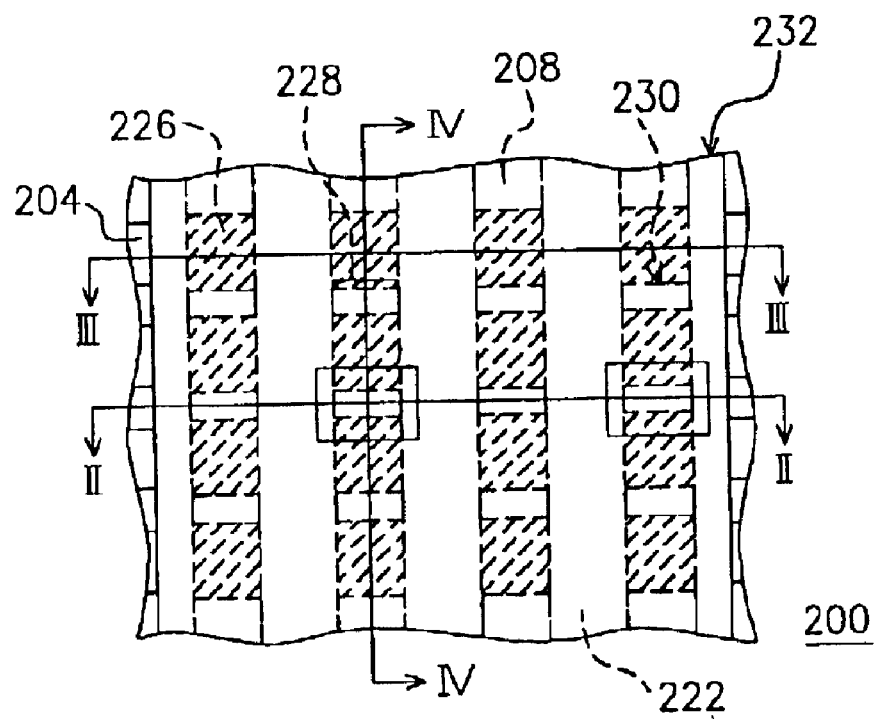
Figure 4A:
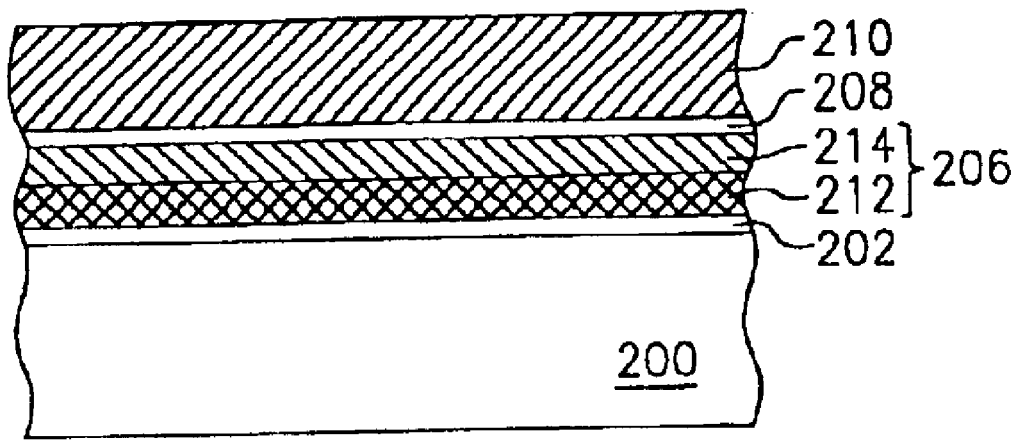
FIGS. 4A~4F illustrate the same process flow illustrated in FIGS. 3A~3F in a cross-sectional view along line II—II.
Figure 4B:
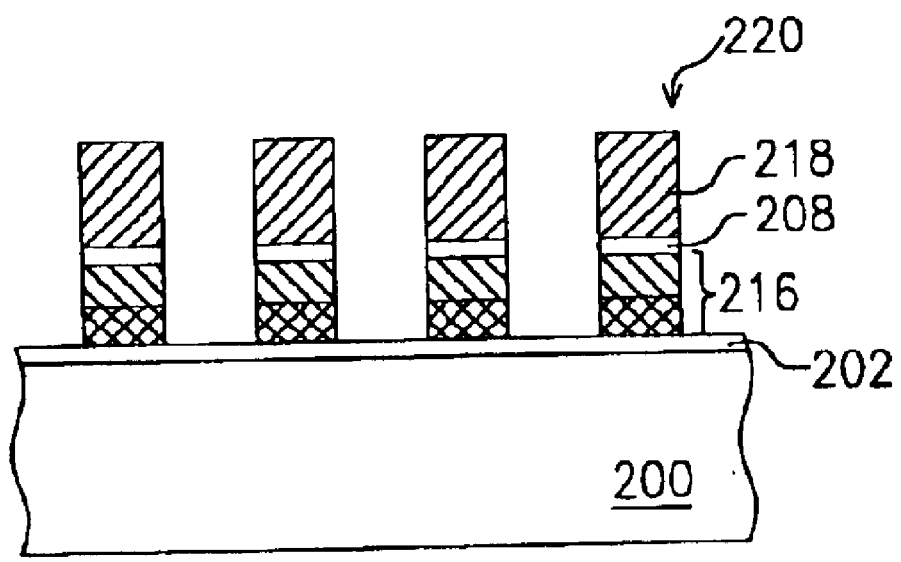
Figure 4C:
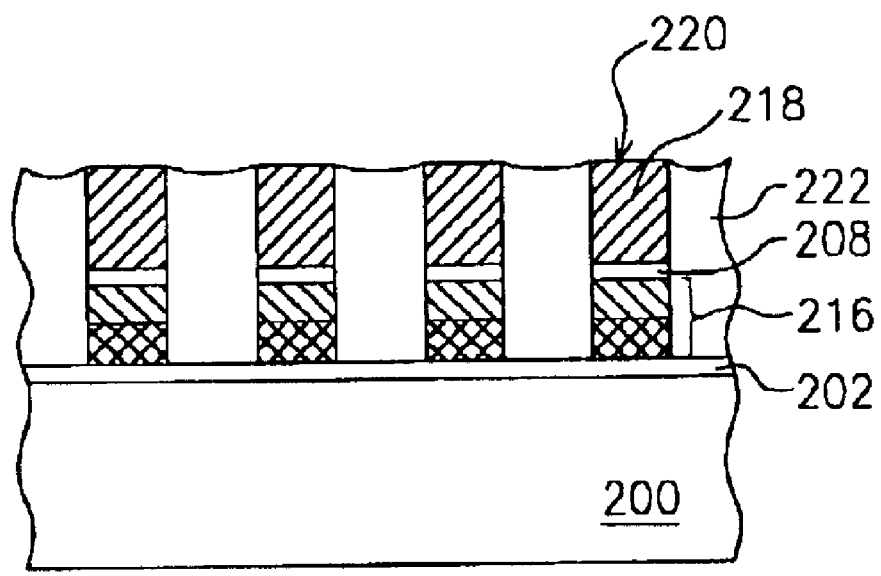
Figure 4D:
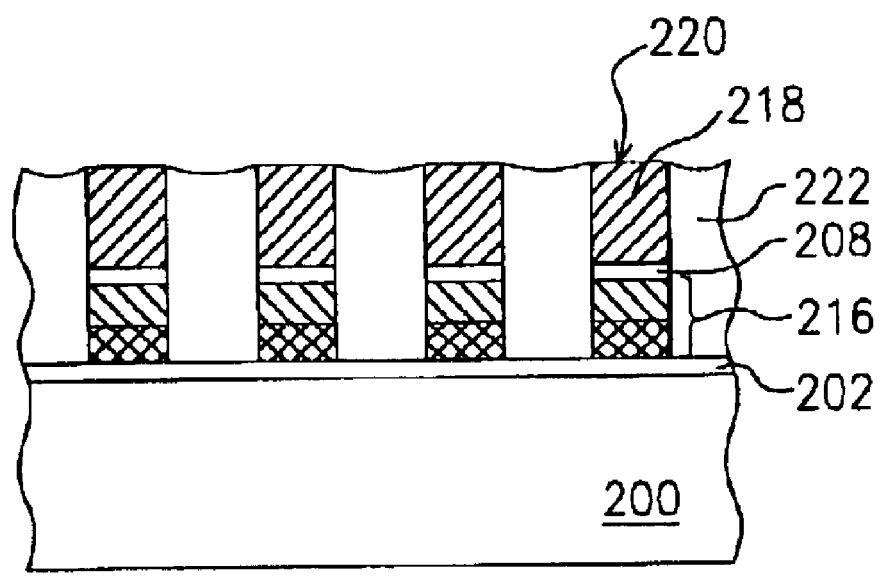
Figure 4E:
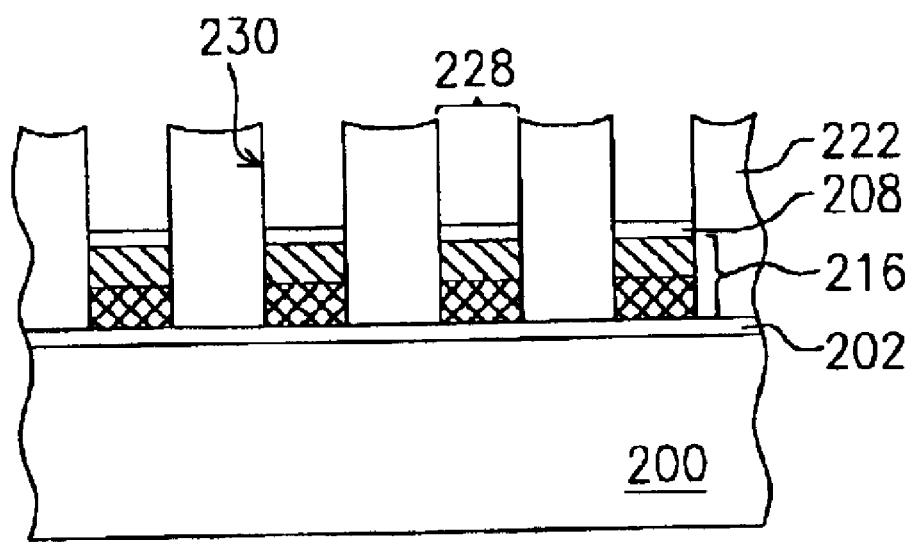
Figure 4F:
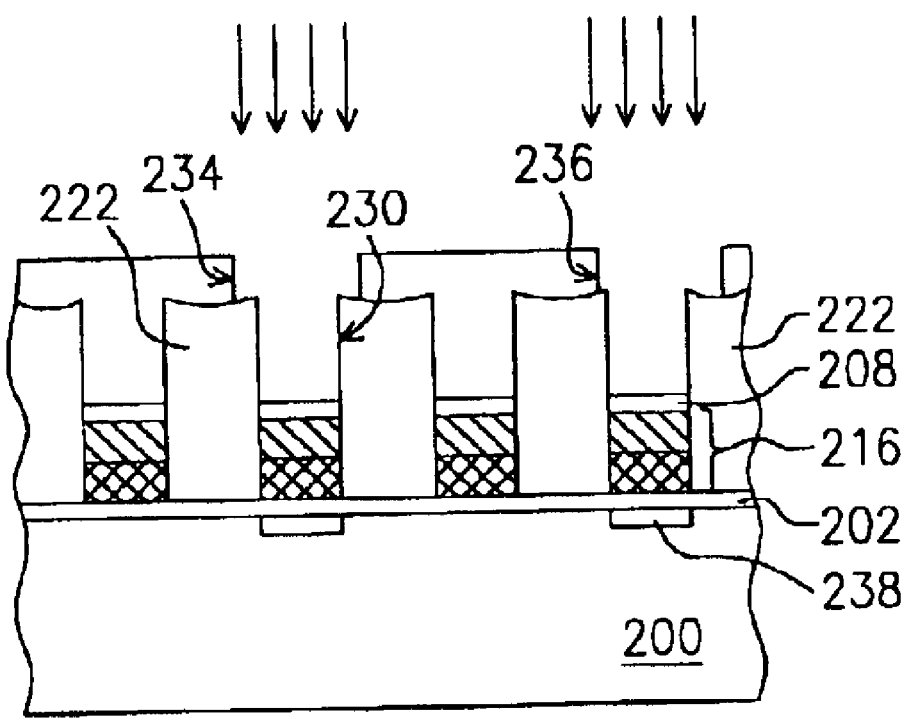
Figure 5A:
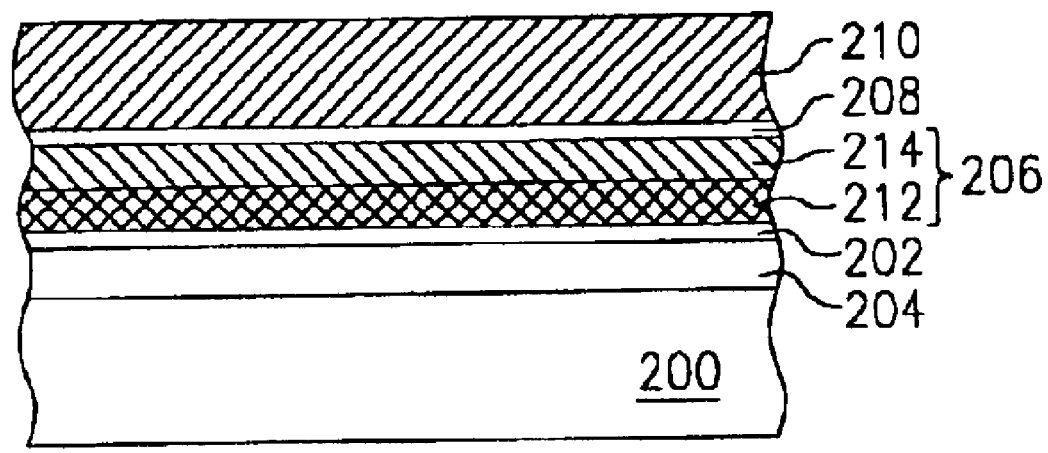
FIGS. 5A~5F illustrate the same process flow illustrated in FIGS. 3A~3F in a cross-sectional view along line III—III.
Figure 5B:
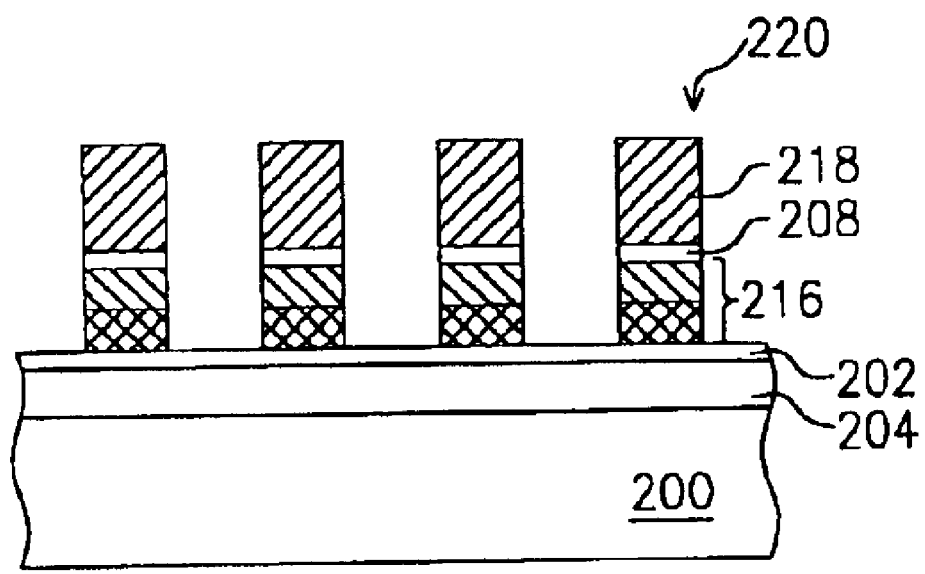
Figure 5C:
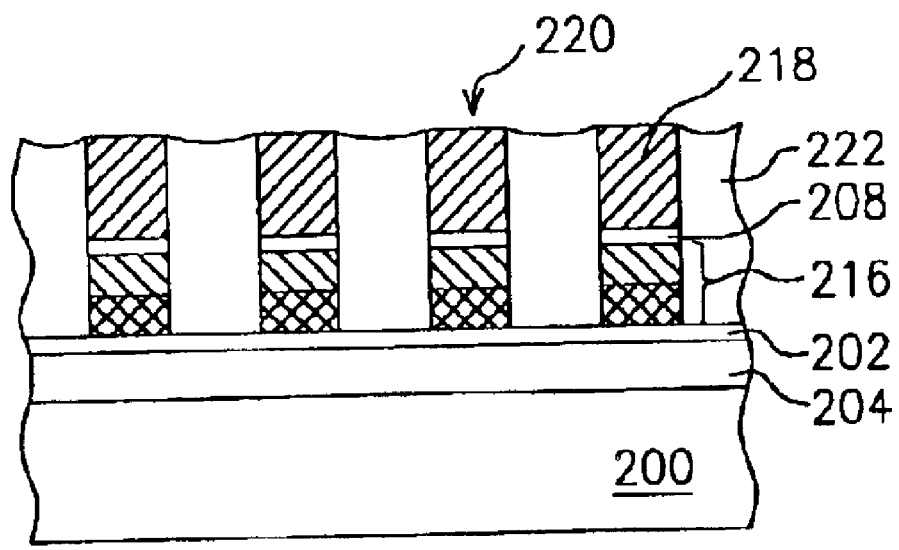
Figure 5D:
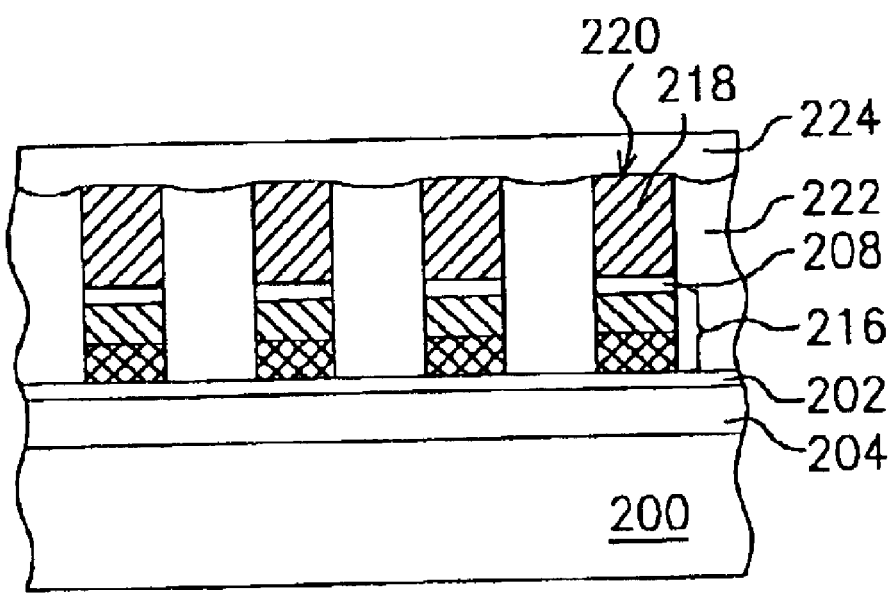
Figure 5E:
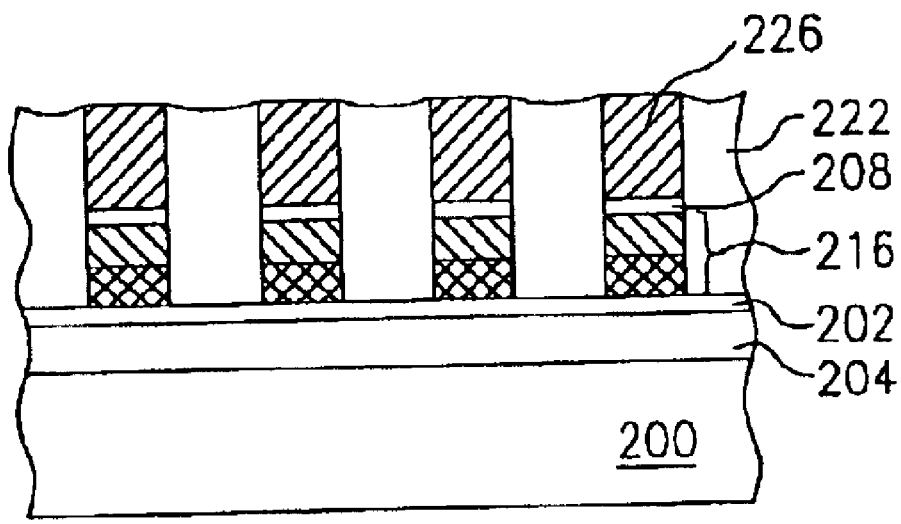
Figure 5F:
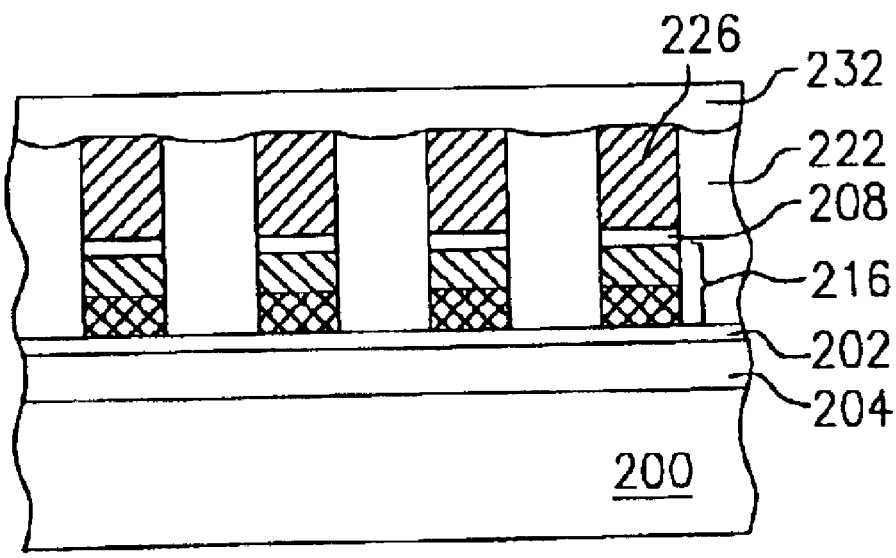
Figure 6A:
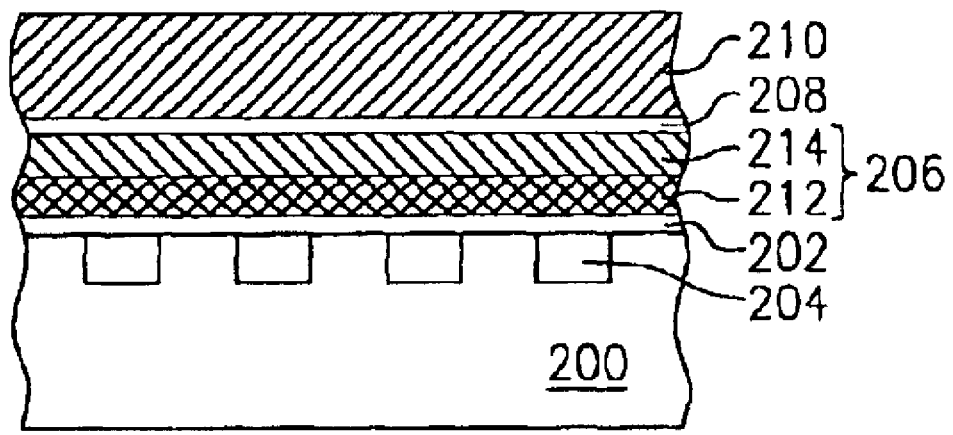
FIGS. 6A~6F illustrate the same process flow illustrated in FIGS. 3A~3F in a cross-sectional view along line IV—IV.
Figure 6B:
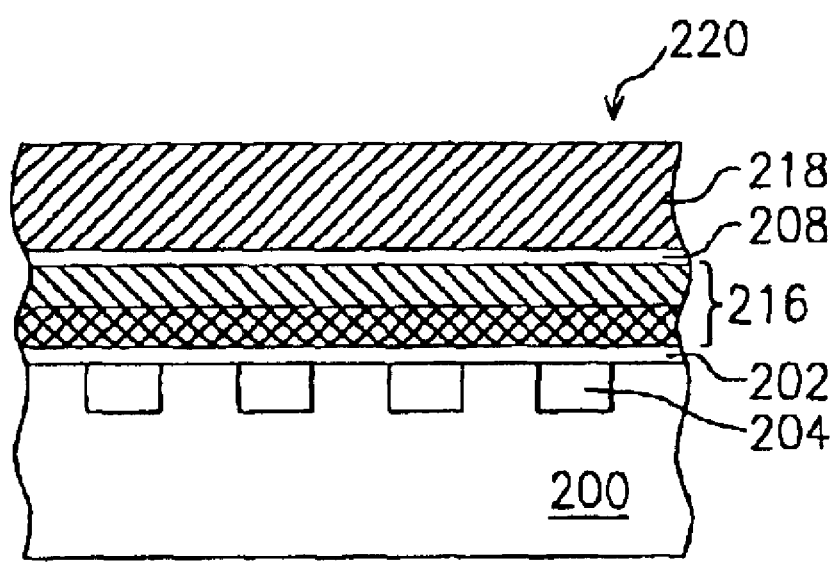
Figure 6C:
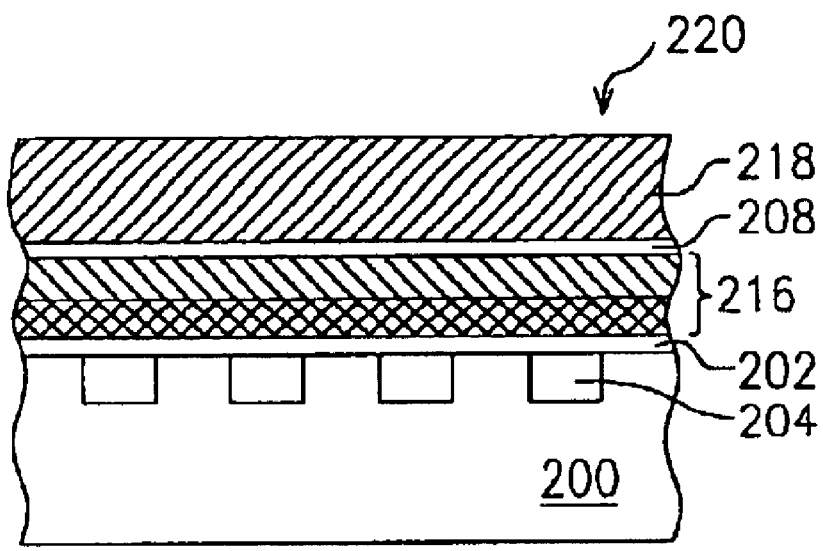
Figure 6D:
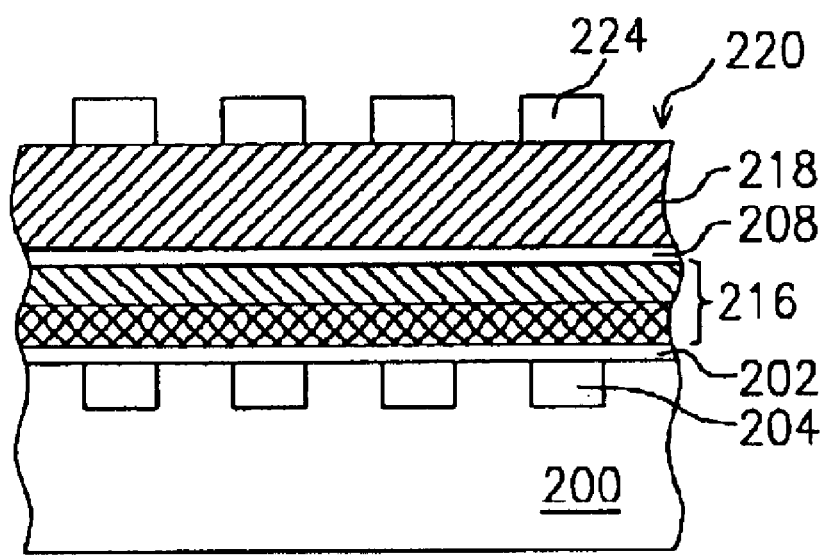
Figure 6E:
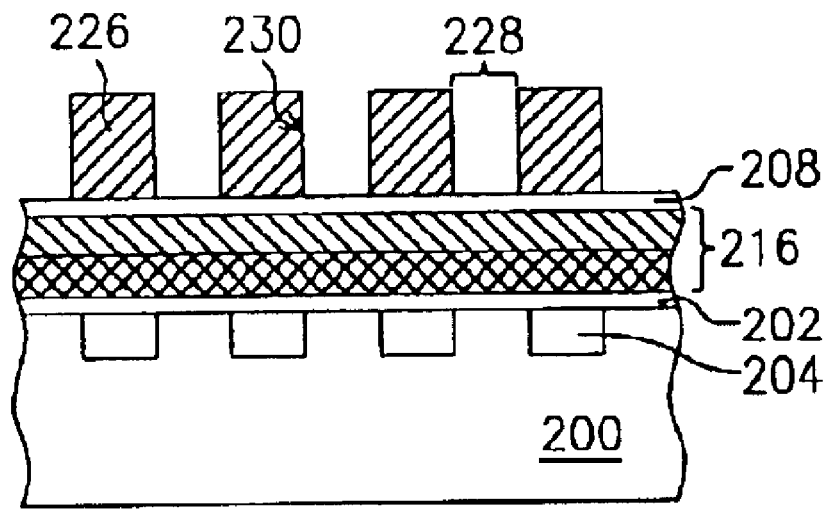
Figure 6F:
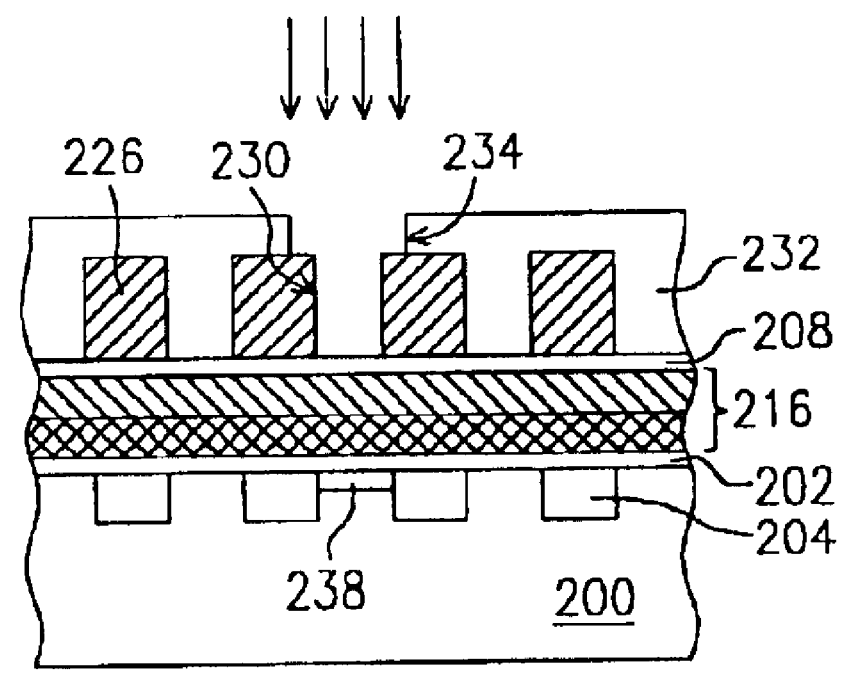

FIGS. 3A~3F, 4A~4F, 5A~5F and 6A~6F schematically illustrate a process flow of fabricating a Mask ROM with self-aligned coding according to the preferred embodiment of this invention. FIGS. 3A~3F illustrate the process flow in a top view, and FIGS. 4A~4F, 5A~5F and 6A~6F in three cross-sectional views along line II—II, line III—III and line IV—IV, respectively.

Refer to FIGS. 3A, 4A, 5A and 6A, a substrate 200, such as a silicon substrate, is provided, and then a gate dielectric layer 202 is formed on the substrate 200. The gate dielectric layer 202 comprises, for example, silicon oxide, and is formed by using thermal oxidation.

A plurality of buried bit lines 204 are formed in the substrate 200 with the following steps, for example. A patterned mask layer is formed exposing a plurality of strip regions of the substrate, and a doping process is performed using the patterned mask layer as a mask to dope the strip regions of the substrate. A rapid thermal annealing process (RTA) is then conducted to repair the damaged lattice structures in the substrate 200. In the above process, the doping process is, for example, an ion implantation process using an N-type ion. The patterned mask layer is then removed.

Thereafter, a conductive layer 206, an isolating layer 208 and a blocking layer 210 are sequentially formed on the substrate 200. The conductive layer 206 comprises a material such as polycide, and is formed by, for example, forming a doped polysilicon layer 212 on the substrate 200 by using chemical vapor deposition (CVD) with in-situ doping, and then forming a metal silicide layer 214 on the polysilicon layer 212. The metal silicide layer 214 comprises a material such as nickel silicide ($NiSi_x$), tungsten silicide ($WSi_x$), cobalt silicide ($CoSi_x$), titanium silicide ($TiSi_x$), platinum silicide ($PtSi_x$) or palladium silicide ($PdSi_x$). The isolating layer 208 comprises an isolating material such as silicon oxide to isolate the conductive layer 206 from the blocking layer 210, and is formed by using thermal oxidation or chemical vapor deposition (CVD). The blocking layer 210 comprises, for example, polysilicon, and is formed by using a method such as CVD. Besides, the blocking layer 210 may comprise silicon nitride, silicon oxynitride or other materials.

Refer to FIGS. 3B, 4B, 5B and 6B, a lithography process and an etching process are performed to pattern the blocking layer 210, the isolating layer 208 and the conductive layer 206 to form a plurality of word lines 216 and a plurality of blocking strips 218. A word line 216 and the blocking strip 218 thereon together constitute a stacked strip structure 220.

Refer to FIGS. 3C, 4C, 5C and 6C, another blocking layer (not shown) is formed all over the substrate 200 to fill the gaps between the stacked strip structures 220. A portion of the blocking layer is removed until the tops of the stacked strip structures 220 are exposed in order to form a plurality of blocking strips 222 between the stacked strip structures 220. The blocking strips 222 comprise a material different from that of the blocking strips 218, so that an etching selectivity can be made between them. The blocking strips 222 comprises, for example, silicon oxide formed by using CVD with tetraethylorthosilicate (TEOS)/$O_3$ as reaction gases. The method for removing a portion of the blocking layer to form the blocking strips 222 comprises chemical mechanical polishing (CMP) or etching-back.

Refer to FIGS. 3D, 4D, 5D and 6D, a patterned mask layer 224 is formed on the substrate 200. The mask layer 224 comprises a material such as photoresist, and consists of a plurality of strip patterns perpendicular to the stacked strip structures 220, wherein each strip pattern is located over a buried bit line 204.

Refer to FIGS. 3E, 4E, 5E and 6E, an anisotropic etching process is performed to remove the blocking strips 218 exposed by the mask layer 224 to form an array of blocking bumps 226. In the anisotropic etching process, the mask layer 224 serves as an etching mask, and the isolating layer 208 serves as an etching stop layer. The mask layer 224 is then removed. The blocking bumps 226 and the blocking strips 222 together define a plurality of pre-coding windows 230 and a plurality of pre-coding regions 228 in the substrate 200 under the pre-coding windows 230.

Refer to FIGS. 3F, 4F, 5F and 6F, a coding mask layer 232 with coding windows 234 and 236 therein is formed on the substrate 200 by sequentially performing photoresist coating, exposure, development and related processes, wherein the exposing process uses a coding photo-mask. Then, a coding implantation is performed using the mask layer 232, the blocking bumps 226 and the blocking strips 222 as a mask to implant ions into the substrate 200 under the pre-coding windows 230 exposed by the coding windows 234 and 236 to form implanted coding regions 238. In this step, since the pre-coding windows 230 have been formed under, the coding implantation can self-align to the selected channel regions under the coding windows 234 and 236 even if the coding window 236 is misaligned to the pre-coding regions 228. Therefore, the coding windows 234 and 236 in the coding mask layer 232 as well as the apertures on the photo-mask can be formed larger without causing coding errors. Moreover, since the implantation profile of a implanted coding regions 238 is determined by two blocking bumps 226 and two blocking strips 222, a required tetragonal implantation profiles can be obtained without being affected by corner rounding of the coding windows 234 and 236. Furthermore, since the coding windows 234 and 236 can be formed larger, the aperture sizes on the photo-mask can be increased to reduce the cost of fabricating the photo-mask and to shorten the turn-around time (TAT) of mass production.

Thereafter, the coding mask layer 232 is removed, and subsequent processes are performed to finish the manufacturing process of the Mask ROM. Since the subsequent processes are well known to those skilled in the art, their descriptions are omitted.

As mentioned above, Since the blocking bumps and the second blocking strips together define the pre-coding windows and block the regions outside the coding regions, the coding implantation can self-align to the coding regions under the coding windows to avoid coding errors even if misalignment occurs. Therefore, the coding windows can be formed larger without causing coding errors.

Moreover, each coding window is surrounded by two blocking bumps and two of the second blocking strips, and therefore has a tetragonal shape. Since the coding implantation profile of a selected memory cell under a coding window is determined by the shape of the corresponding pre-coding window, corner rounding of the coding windows will not adversely affect the coding implantation profile to cause coding errors.

Furthermore, since the coding windows can be formed larger, the aperture sizes of the photo-mask can be increased to reduce the cost of fabricating the photo-mask and to shorten the turn-around time (TAT) of mass production.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a Mask ROM, comprises:

forming a plurality of buried bit lines in a substrate;

forming a gate dielectric layer on the substrate;

forming a conductive layer on the substrate;

forming a first blocking layer on the conductive layer;

patterning the first blocking layer and the conductive layer into a plurality of first blocking strips and a plurality of word lines, respectively;

forming a plurality of second blocking strips between the word lines and between the first blocking strips;

forming a first patterned photoresist layer on the substrate covering the buried bit lines;

removing a portion of the first blocking strips to form a plurality of blocking bumps by using the first patterned photoresist layer as a mask, wherein the blocking bumps and the second blocking strips together define a plurality of pre-coding windows;

removing the first patterned photoresist layer;

forming a second patterned photoresist layer having a plurality of coding windows therein on the substrate, wherein the coding windows expose selected pre-coding windows and a coding window is larger than a pre-coding window;

performing a coding implantation to form a plurality of implanted coding regions under the selected pre-coding windows exposed by the coding windows with the second patterned photoresist layer, the blocking bumps and the second blocking strips as mask; and removing the second patterned photoresist layer.

2. The method of claim 1, wherein the first blocking layer comprises polysilicon.

3. The method of claim 1, further comprising forming an isolating layer on the conductive layer before the first blocking layer is formed.

4. The method of claim 3, wherein the isolating layer comprises silicon oxide.

5. The method of claim 1, wherein an etching rate of the second blocking strips is lower than that of the first blocking strips during removing a portion of the first blocking strips to form the blocking bumps.

6. The method of claim 1, wherein the gate dielectric layer comprises a gate oxide layer.

7. The method of claim 1, wherein forming a plurality of second blocking strips between the word lines and between the first blocking strips comprises:

forming a second blocking layer on the substrate filling gaps between the word lines and between the first blocking strips; and removing a portion of the second blocking layer until tops of the first blocking strips are exposed.

8. The method of claim 7, wherein removing a portion of the second blocking layer comprises performing chemical mechanical polishing (CMP).

9. The method of claim 7, wherein removing a portion of the second blocking layer comprises performing etching-back.

10. The method of claim 1, wherein the step of performing the coding implantation includes an implantation angle substantially perpendicular to the substrate.

11. A method for fabricating a Mask ROM, comprises:

forming a plurality of buried bit lines in a substrate;

forming a plurality of word lines and a plurality of first blocking strips thereon on the substrate;

forming a plurality of second blocking strips between the word lines and between the first blocking strips;

patterning the first blocking strips into a plurality of blocking bumps, wherein the blocking bumps and the second blocking strips together define a plurality of pre-coding windows;

forming a coding mask layer having a plurality of coding windows therein on the substrate, wherein the coding windows expose selected pre-coding windows;

performing a coding implantation to form a plurality of implanted coding regions under the selected pre-coding windows exposed by the coding windows; and removing the coding mask layer.

12. The method of claim 11, wherein forming the word lines and the first blocking strips comprises:

forming a conductive layer on the substrate;

forming a first blocking layer on the conductive layer; and patterning the first blocking layer and the conductive layer into a plurality of first blocking strips and a plurality of word lines, respectively.

13. The method of claim 12, wherein the first blocking layer comprises polysilicon.

14. The method of claim 12, further comprising forming an isolating layer on the conductive layer before the first blocking layer is formed.

15. The method of claim 14, wherein the isolating layer comprises silicon oxide.

16. The method of claim 11, wherein an etching rate of the second blocking strips is lower than that of the first blocking strips during patterning the first blocking strips to form the blocking bumps.

17. The method of claim 11, further comprising forming a gate dielectric layer on the substrate before the buried bit lines are formed.

18. The method of claim 11, wherein forming a plurality of second blocking strips between the word lines and between the first blocking strips comprises:

forming a second blocking layer on the substrate filling gaps between the word lines and between the first blocking strips; and removing a portion of the second blocking layer until tops of the first blocking strips are exposed.

19. The method of claim 18, wherein removing a portion of the second blocking layer comprises performing chemical mechanical polishing (CMP).

20. The method of claim 18, wherein removing a portion of the second blocking layer comprises performing etching-back.

21. The method of claim 11, wherein the coding mask layer comprises a patterned photoresist layer.

22. The method of claim 11, wherein the step of performing the coding implantation includes an implantation angle substantially perpendicular to the substrate.

* * * * *